(12) United States Patent
Tasch et al.

(10) Patent No.: US 7,187,011 B2
(45) Date of Patent: *Mar. 6, 2007

(54) LIGHT SOURCE WITH A LIGHT-EMITTING ELEMENT

(75) Inventors: Stefan Tasch, Jennersdorf (AT); Peter Pachler, Graz (AT); Gundula Roth, Levenhagen (DE); Walter Tews, Greifswald (DE); Wolfgang Kempfert, Bad Liebenstein (DE); Detlef Starick, Bad Liebenstein (DE)

(73) Assignee: Toyoda Gosei Co., Ltd., Aichi-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/974,420

(22) Filed: Oct. 26, 2004

(65) Prior Publication Data

US 2005/0082574 A1 Apr. 21, 2005

Related U.S. Application Data

(63) Continuation of application No. 10/250,435, filed as application No. PCT/AT01/00364 on Nov. 19, 2001, now Pat. No. 6,809,347.

(30) Foreign Application Priority Data

Dec. 28, 2000 (AT) .............................. A 2154/2000

(51) Int. Cl.
*H01L 33/00* (2006.01)
(52) U.S. Cl. ........................... 257/103; 257/89; 257/90
(58) Field of Classification Search ................ 257/103, 257/79, 89, 98; 313/503
See application file for complete search history.

(56) References Cited

U.S. PATENT DOCUMENTS 6,252,254 B1    6/2001  Soules et al.
6,809,347 B2 * 10/2004  Tasch et al. ................. 257/103

OTHER PUBLICATIONS

Poort, S., et al., "Optical Properties of Eu-activation Orthosilicates and Orthophosphates," Journal of Alloys and Compounds, vol. 260 No. 1, Sep. 12, 1997, pp. 93-97.

* cited by examiner

*Primary Examiner*—Sara Crane
(74) *Attorney, Agent, or Firm*—Mayer & Williams PC; Mark D. Wieczorek, Esq.

(57) ABSTRACT

The invention relates to a light source comprising a light-emitting element, which emits light in a first spectral region, and comprising a luminophore, which comes from the group of alkaline-earth orthosilicates and which absorbs a portion of the light emitted by the light source and emits light in another spectral region. According to the invention, the luminophore is an alkaline-earth orthosilicate, which is activated with bivalent europium and whose composition consists of: $(2-x-y)SrOx(Ba, Ca)O\ (1-a-b-c-d)SiO_2\ aP_2O_5\ bAl_2O_3\ cB_2O_3\ dGeO_2$: y $Eu^{2+}$ and/or $(2-x-y)BaO\ x((Sr, Ca)O\ (1-a-b-c-d)SiO_2\ aP_2O_5\ bAl_2O_3\ cB_2O_3\ dGeO_2$: y $Eu^{2+}$. The desired color (color temperature) can be easily adjusted by using a luminophore of the aforementioned type. The light source can contain an additional luminophore selected from the group of alkaline-earth aluminates, activated with bivalent europium and/or manganese, and/or can contain an additional red-emitting luminophore selected from the group $Y(V, P, Si)O_4$:Eu or can contain alkaline-earth magnesium disilicate.

9 Claims, 4 Drawing Sheets

LIGHT SOURCE WITH A LIGHT-EMITTING ELEMENT

STATEMENT OF RELATED APPLICATIONS

Figure 1:
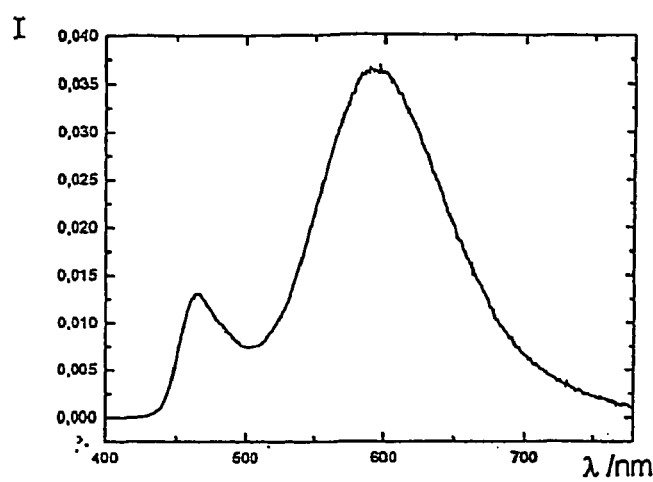

This application is a continuation of U.S. patent application Ser. No. 10/250,435 filed Dec. 22, 2003, entitled "Light Source Comprising A Light-Emitting Element," now U.S. Pat. No. 6,809,347, which is a 371 of PCT/AT01/00364, filed Nov. 19, 2001.

TECHNICAL REALM

The invention relates to a light source to create white light comprised of a light comprised of the light-emitting diode (LED) to emit a blue and/or ultraviolet emission, and at least one luminophore that itself emits light as well as a blue and/or ultraviolet component in another region of the spectrum.

STATE OF THE ART

Inorganic LED's distinguish themselves by, among other things, long service life, low space requirements, insensitivity to vibration, and narrow-band spectral emissions.

Numerous emission colors, especially wide-band spectral colors, cannot be realized from LED's because of the intrinsic emission of an active semiconductor material, or can only be inefficiently realized. This especially applies to the creation of white light.

WO 00/33390 shows a light-emitting device that is comprised of an exclusively blue-emitting LED or laser diode that interacts with a mixture of luminescent material. An LED emitting light in the spectral range between 420 and 470 nm is combined with a mixture of luminescent material consisting of at least two luminescent materials in order to produce white light. The two absolutely necessary luminescent materials must emit light at different wavelengths. The luminescent material mixture used always includes a red component and a green component. White light is produced by additive color combination with the blue light emitted from the LED.

In accordance with the state of the art, emission colors that cannot be intrinsically realized by a semiconductor are created using color conversion.

The technique of color conversion is essentially based on the principle that at least one luminophore is positioned above the LED "die." It absorbs a portion of the emission from the die, and is thus excited to photo-luminescence. The emission or light color of the source then results from the mixing of the emission transmitted from the die with the emission emitted from the luminescent material.

Either organic or inorganic systems may basically be used. The significant advantage of inorganic pigments is their higher chemical, thermal, and emission stability in comparison to organic systems. In connection with the long service life of inorganic LED's, long-life inorganic luminophores ensure a high level of color stability of the light source consisting of both light sources.

If the emitted emission from LED's emitting blue is to be converted into white light, luminescent materials are used that effectively absorb the blue light (450–490 nm) and convert it into predominantly yellow luminescent emission. However, there is only a limited number of inorganic luminophores that meet these specifications. At this time, materials from the YAG class of luminescent materials are used as color conversion pigments for blue LED's (WO 98/05078;WO98/05078; WO98/12757). These, however, include the disadvantage that they possess a high degree of efficiency only at an emission maximum of less than 560 nm. For this reason, only cold white light colors with color temperatures between 6,000 K and 8,000 K, and accordingly with comparatively reduced color reproduction (typical values for color reproduction index Ra lie between 70 and 75), may be used with the YAG pigments in combination with blue diodes (450–490 nm). This results in severely-limited application possibilities. On the one hand, higher demands are imposed as a rule during application of white-light sources for general illumination, and on the other, consumers in Europe and North America prefer warmer light colors with color temperatures between 2,700 and 5,000 K.

It is further known from WO 00/33389 to use $Ba_2SiO_4$: $Eu^{2+}$ among others as a luminophore to convert the light from blue LED's. The maximum of the emission from the $Ba_2SiO_4$:$Eu^{2+}$ luminescent material is, however, 505 nm, so that white light cannot be reliably created using such a combination.

In works by S. H. M. Poort et al.: "Optical Properties of $Eu^{2+}$-activated orthosilicates and orthophosphates," Journal of Alloys and Compounds 260 (1997), pp. 93–97, the characteristics of Eu-activated $Ba_2SiO_4$ and of phosphates such as $KBaPO_4$ and $KSrPO_4$ are investigated. It was also determined here that the emission from $Ba_2SiO_4$ is about 505 nm.

PUBLICATION OF THE INVENTION

The task of this invention is to present an improved light source that uses a light-emitting-diode (LED) as its emission source, whereby this light source may emit in the ultra-violet (UV) range or the blue range (370 to 490 nm), and which is in the position to create white light with high efficiency by virtue of improved luminescent material, so that use of this white-light source is possible for illumination purposes.

At the same time, it is desirable to avoid the disadvantages known from the State of the Art.

For this, it should further be possible to adjust the color temperatures across a wide range using one or more luminescent materials in order to fulfill various user demands and particularly to adjust those color locations that lie within the tolerance ellipses established by the CIE for general illumination.

This task is solved based on the invention by a light source of the type mentioned at the outset so that The luminophore is an alkaline-earth ortho-silicate activated with bivalent Europium of one of the following compounds or a mixture of these compounds:

$(2-x-y)SrO.x(Ba_u, Ca_v)O.(1-a-b-c-d)$
$SiO_2.aP_2O_5bAl_2O_3 cB_2O_3 dGeO_2:yEu^{2+}$   a)

where

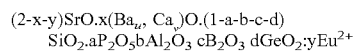

| $0 \leq x < 1.6$ | $0.005 < y < 0.5$ | $x + y \geq 1.6$ |
| $0 \leq a, b, c, d < 0.5$ | $u + v = 1$ | | applies;

$(2-x-y)BaO.x(Sr_u, Ca_v)O.(1-a-b-c-d)$
$SiO_2.aP_2O_5bAl_2O_3 cB_2O_3 dGeO_2:yEu^{2+}$   b)

where

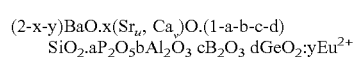

| $0.01 < x < 1.6$ | $0.005 < y < 0.5$ | |
| $0 \leq a, b, c, d < 0.5$ | $u + v = 1$ | $x \cdot u \geq 0.4$ | applies;

The luminophore emits emission in the yellow-green, yellow, or orange spectral regions;

The color temperature and overall color index of the created white light may be adjusted by selection of parameters in die above-mentioned regions.

In an advantageous embodiment, at least one of the values a, b, c, and d is greater than 0.01. Further, in the above-mentioned luminophore, a portion of the Silicon may be replaced by Gallium.

Surprisingly it has been found that white light with good color reproduction and a high degree of luminous efficiency may be realized through a combination of a blue LED with a luminophore selected from a group of alkaline-earth ortho-silicates activated with Europium of the above-named composition based on the invention. In contrast to luminophores based on pure barium ortho-silicates that emit blue light, yellow-green and yellow to orange luminescent light may be created using Barium-Strontium-orthosilicate mixed crystals, and even completely orange luminescent light may be created by incorporation of Calcium into the ortho-silicate crystal lattice, so that, by mixing the transmitted light from the blue LED with the luminescent light from the selected luminophore, white light with good color reproduction and a high degree of luminous efficiency may be generated. Displacement of emission color by means of substitution of Ba with Sr in ortho-silicates has previously been known only for excitation using hard UV emission (254-nm excitation) from the above-mentioned work by Poort et al. No description was made of the fact that this effect surprisingly occurs more strongly under irradiation with blue light in the range of 440–475 nm. Ba-Sr-Ca ortho-silicate mixed crystals and their strong emission capability under excitation with low-frequency UV emission or blue light were previously completely unknown.

The selected luminophore may also be used in mixtures with other luminophores of this group and/or with additional luminescent materials not belonging to this group. The latter luminophores include, for example, blue-emitting alkaline-earth aluminates activated using bivalent Europium and/or Manganese, along with the red-emitting luminophores of the group Y(V,P,Si)O$_4$:Eu,Bi, Y$_2$O$_2$S:Eu,Bi, or :Eu$^{2+}$,Mn$^{2+}$ alkaline-earth Magnesium di-silicates activated with Europium or Manganese according to the formula

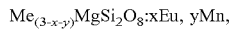

Me$_{(3-x-y)}$MgSi$_2$O$_8$:xEu, yMn, whereby 0.005<x<0.5 0.005<y<0.5 and Me=Ba and/or Sr and/or Ca applies.

As will be shown in the following embodiment examples, the Sr component in the mixed-crystal luminophores based on the invention must not be too small in order to be able to generate white light.

Surprisingly, it has further been found that the additional inclusion of P$_2$O$_5$, Al$_2$O$_3$, and/or B$_2$O$_3$ into the crystal lattice, as well as the substitution of a portion of the Silicon by Germanium, may also have a significant influence on the emission spectrum of a given luminophore, so that this may be further advantageously varied for a particular application. For this, smaller ions than Si(IV) cause displacement of the emission maximum into a lower-frequency range, while larger ions displace the bulk of the emission into higher frequencies. It could further be shown that it is advantageous for the crystallinity, emission capability, and particularly for the stability of luminophores based on the invention if small amounts of monovalent ions such as halogenides and/or alkali metal ions are additionally included in the luminophore.

Based on a further advantageous embodiment of the invention, the light source includes at least two different luminophores, whereby at least one is an alkaline-earth ortho-silicate luminescent material. The white tone required for a particular application may be especially accurately adjusted in this manner, and Ra values greater than 80 may particularly be achieved. A further advantageous version of the invention consists of a combination of an LED emitting in the ultra-violet range of the spectrum, e.g., in the range between 370 and 390 nm, with at least three luminescent materials, of which at least one is an alkaline-earth ortho-silicate luminescent material based on the invention. Blue-emitting alkaline-earth aluminates activated with Europium and/or manganese and/or red-emitting luminophores from the group Y(V,P,Si)O$_4$:Eu,Bi, Y$_2$O$_2$S:Eu,Bi, or from the group of alkaline-earth Magnesium di-silicates activated with Europium and Manganese may be used as additional luminescent materials in corresponding mixtures of luminescent materials.

Several options exist for mechanical implementation of the light source based on the invention. Based on one embodiment example, it is intended that one or more LED chips be positioned on a circuit board within a reflector, and the luminophore be dispersed in a light disk positioned above the reflector.

It is also possible to position one or more LED chips on a circuit board within the reflector, and to mount the luminophore on the reflector.

The LED chips are preferably cast in a domed shape using a transparent casting compound. On the one hand, this casting compound provides mechanical protection, and on the other, it also improves the optical characteristics (better escape of the light from the LED dice).

The luminophore may also be dispersed in a casting compound that connects a configuration of LED chips on a circuit board with a polymer lens, preferably one without gas content, whereby the polymers and the casting compound include refractive indices that vary from one another by no more than 0.1. This casting compound may directly include the LED dice, but it is also possible that they be cast using a transparent casting compound (this results in a transparent casting compound and a casting compound containing the luminophore). Because of the similar refractive indices, there is very little loss at the bordering surfaces due to reflection.

The polymer lens preferably is of spherical or ellipsoid shape that is filled by the casting compound, so that the LED array is secured closely adjacent to the polymer lens. The height of the mechanical structure may thus be reduced.

In order to achieve uniform distribution of the luminophore, it is useful if the luminophore is reduced to slurry in a preferably inorganic matrix.

When using at least two luminophores, it is useful if the minimum two luminophores are individually dispersed within matrices that are positioned one after the other within the spread of light. Thus, the concentration of luminophores may be reduced in comparison to that obtained in a uniform dispersion of various luminophores, The essential steps to manufacture the luminophore using an advantageous version of the invention are shown in the following:

Depending on the selected composition for production of the alkaline-earth ortho-silicate luminophore, the stoichiometric quantities of alkaline-earth carbonate, Silicon dioxide, and Europium oxide output materials are mixed internally, and are converted into the desired luminophore using the solid-body reaction conventionally used in the production of luminescent materials in reduced atmosphere at temperatures between 1100° C. and 1400° C. For this, it is advantageous for the crystallinity to add small amounts, preferably smaller than 0.2 mol, of ammonium chloride or other halogens to the reaction mixture. Within the meaning of the displayed invention, a portion of the Silicon may be replaced by Germanium, Boron, Aluminum, or Phosphorus, which may be realized by the addition of corresponding amounts of compounds of the named elements that may be converted thermally into oxides. In a similar manner, it is possible for small amounts of alkali metal ions to be included in the particular lattice.

The ortho-silicate luminophores thus obtained emit at wavelengths between about 510 nm and 600 nm, and possess a half-width value of up to 110 nm.

By means of proper configuration of reaction parameters and specific additives, e.g., of monovalent halogenide and/or alkali metal ions, the distribution of grain sizes of the luminophore based on the invention may be adapted to the demands of the particular application without having to use damaging mechanical size-reduction processes. In this manner, all narrow-and wide-band grain-size distributions with mean grain sizes $d_{50}$ of about 2 μm and 20 μm may be adjusted.

BRIEF DESCRIPTION OF THE ILLUSTRATIONS

Further advantages of the invention are explained in the following using embodiment examples and Figures.

FIGS. 1–6 show spectra (relative intensity I dependent on wavelength) of various LED light sources based on the invention; and FIGS. 7–10 show various embodiment examples of LED light sources based on the invention.

BEST EMBODIMENT EXAMPLES OF THE INVENTION

FIG. 1 shows the emission spectrum of a white LED with a color temperature of 2700 K that is formed by combination of a LED emitting blue light with effective wavelength of 464 nm with luminophore based on the invention of composition $(Sr_{1.4}Ca_{0.6}SiO_4:Eu^{2+})$ that emits light in a second spectral region with a maximum value of 596 nm.

Figure 2:
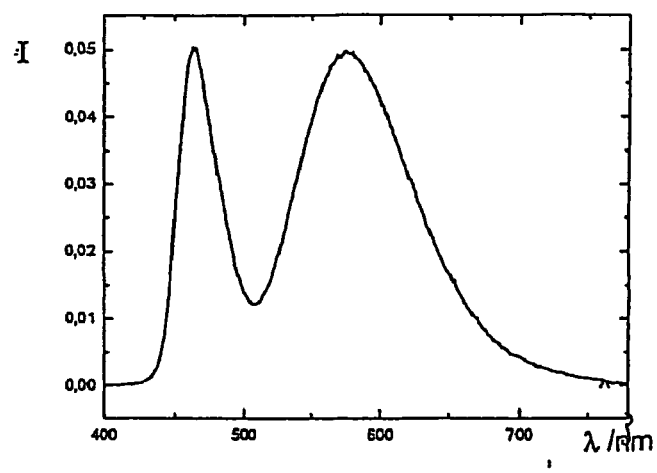
Figure 3:
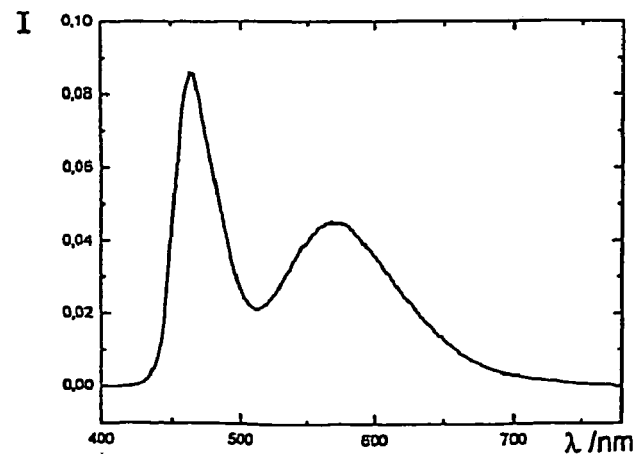

Further examples for the combination of an LED emitting light at 464 nm with one of the ortho-silicate luminophores are shown in FIGS. 2 and 3. If a yellow-emitting luminophore of composition $(Sr_{1.90}Ba_{0.08}Ca_{0.02}SiO_4:Eu^{2+})$ is used for color conversion, a white-light color with color temperature of 4100 K may be set, but with use of the luminophore $(Sr_{1.84}Ba_{0.16}SiO_4:Eu^{2+})$, for example, a white-light color with color temperature of 6500 K may be obtained.

Figure 4:
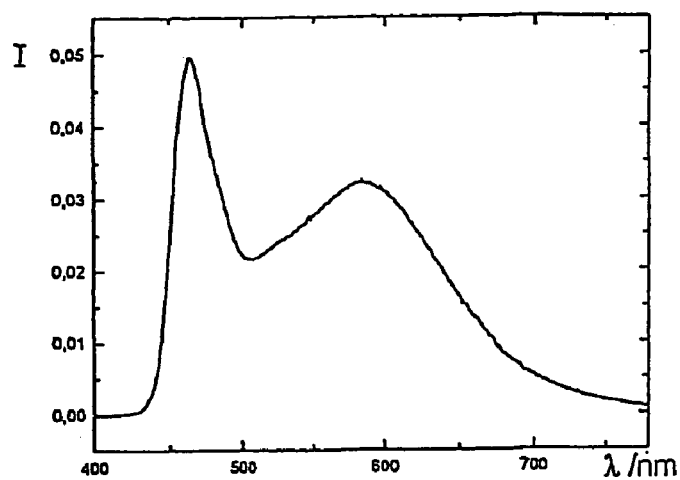

FIG. 4 shows the typical spectrum for the combination of a 464-nm LED with two ortho-silicate luminophores based on the invention. The luminescent materials used possess the compositions $(Sr_{1.4}Ca_{0.6}SiO_4:Eu^{2+})$ and $(Sr_{1.84}Ba_{0.16}SiO_4:Eu^2)$. For the concrete spectrum shown in FIG. 4, a color temperature of 5088 K and a color reproduction index Ra of 82 are obtained. However, depending on the selected quantity ratios of luminophores, all color temperatures in the range of about 3500 K and 7500 K may be achieved, whereby the great advantage of such mixtures of two ortho-silicate luminophores based on the invention consists of the fact that Ra values greater than 80 may be achieved.

Figure 5:
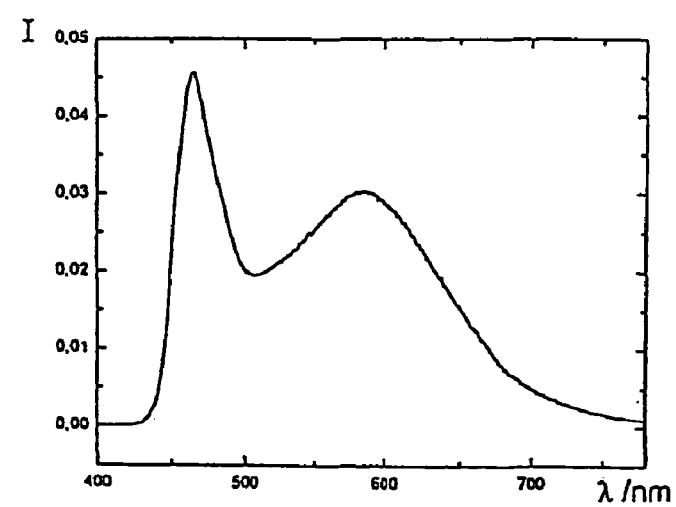

This is documented in FIG. 5 using an example. The spectrum shown stands for the combination of a 464-nm LED with a mixture of the two luminophores with composition of $(Sr_{1.6}Ca_{0.4}Si_{0.98}Ga_{0.02}O_4:Eu^{2+})$ and $(Sr_{1.10}Ba_{0.90}SiO_4:Eu^2)$, which produces an Ra value of 82 at a color temperature of 5000 K.

Figure 6:
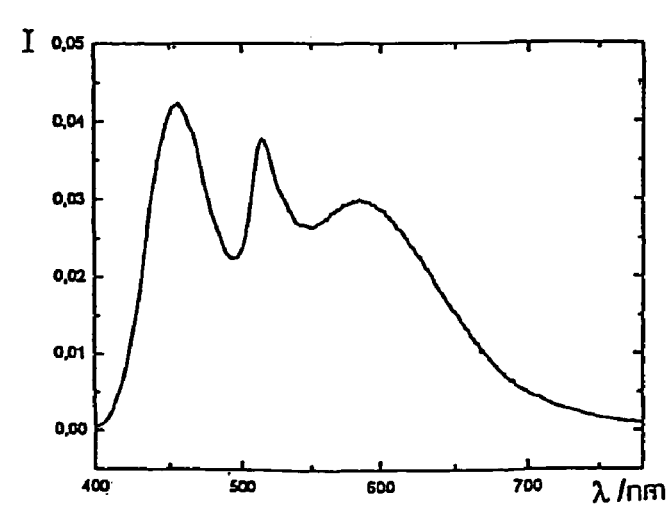
Figure 7:
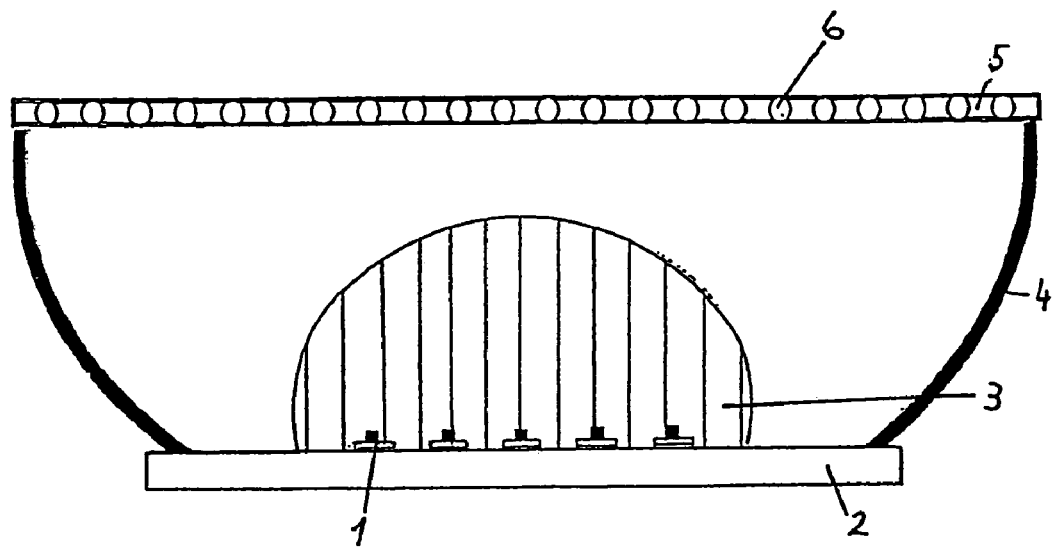

If a UV LED is used as an emission-emitting element that emits in a first spectral region with a maximum of 370–390 nm, then Ra values of greater than 90 may be realized by means of combination of such an LED with a luminescent-material mixture containing the luminophores based on the invention and shown in FIG. 4 as well as a specific portion of a Barium-Magnesium-Aluminate:Eu,Mn luminescent material. FIG. 6 shows the emission spectrum of a corresponding white-light source that produces an Ra value of 91 at a color temperature of 6500 K.

Further examples may be taken from the following presentation. In it, along with the emission wavelengths of the inorganic LED's used, the resulting color temperatures, Ra values, and color locations of the light sources are given for each composition of luminophores based on the invention:

$T=2778$ K (464 nm+$Sr_{1.4}Ca_{0.6}SiO_4:Eu^{2+}$); $x=0.4619$, $y=0.4247$, Ra=72

$T=2950$ K (464 nm+$Sr_{1.4}Ca_{0.6}SiO_4:Eu^{2+}$); $x=0.4380$, $y=0.4004$, Ra=73

$T=3497$ K (464 nm+$Sr_{1.6}Ba_{0.4}SiO_4:Eu^{2+}$); $x=0.4086$, $y=0.3996$, Ra=74

$T=4183$ K (464 nm+$Sr_{1.9}Ba_{0.08}Ca_{0.02}SiO_4:Eu^{2+}$); $x=0.3762$, $y=0.3873$, Ra=75

$T=6624$ K (464 nm+$Sr_{1.9}Ba_{0.02}Ca_{0.08}SiO_4:Eu^{2+}$); $x=0.3101$, $y=0.3306$, Ra=76

$T=6385$ K (464 nm+$Sr_{1.6}Ca_{0.4}SiO_4:Eu^{2+}$+$Sr_{0.4}Ba_{1.6}SiO_4:Eu^{2+}$); $x=0.3135$, $y=0.3397$, Ra=82

$T=4216$ K (464 nm+$Sr_{1.9}Ba_{0.08}Ca_{0.02}SiO_4:Eu^{2+}$); $x=0.3710$, $y=0.3696$, Ra=82

3954 K (464 nm+$Sr_{1.6}Ba_{0.4}SiO_4:Eu^{2+}$+$Sr_{0.4}Ba_{1.6}SiO_4:Eu^{2+}$+$YVO_4:Eu^{3+}$); $x=0.3756$, $y=0.3816$, Ra=84

$T=6489$ K (UV-LED+$Sr_{1.6}Ca_{0.4}SiO_4:Eu^{2+}$+$Sr_{0.4}Ba_{1.6}SiO_4:Eu^{2+}$+Barium Magnesium aluminate:$Eu^{2+}$); x=0.3115, y=0.3390, Ra=86

$T=5097$ K (464 nm+$Sr_{1.6}Ba_{0.4}(Si_{0.98}B_{0.02})O_4:Eu^{2+}$+$Sr_{0.6}Ba_{1.4}SiO_4:Eu^{2+}$); x0.3423, $y=0.3485$, Ra=82

$T=5084$ K (UV-LED+$Sr_{1.6}Ca_{0.4}(Si_{0.99}B_{0.01})O_4$: $Eu^{2+}$+$Sr_{0.6}Ba_{1.4}SiO_4:Eu^{2+}$+Strontium Magnesium aluminate: $Eu^{2+}$); $x=0.3430$, $y=0.3531$, Ra=83

$T=3369$ K (464 nm+$Sr_{1.4}Ca_{0.6}Si_{0.95}Ge_{0.05}O_4:Eu^{2+}$); $x=0.4134$, $y=0.3959$, Ra=74

$T=2787$ K (466 nm+$Sr_{1.4}Ca_{0.6}Si_{0.98}P_{0.02}O_{4.01}:Eu^{2+}$); $x=0.4630$, $y=0.4280$, Ra=72

$T=2913$ K (464 nm+$Sr_{1.4}Ca_{0.6}Si_{0.98}Al_{0.02}O_4:Eu^{2+}$); $x=0.4425$, $y=0.4050$, Ra=73

T=4201 K

In a preferred version of the invention, color conversion is performed as follows:

One or more LED chips 1 (see FIG. 7) are assembled on a circuit board 2. An encapsulation medium 3 in the form of a hemisphere or a half-ellipsoid is positioned directly above the LED's (first, to protect the LED chip, and second, in order to be able better to decouple the light created within the LED chip. This encapsulation medium 3 may either include each die individually, or it may represent a common shape for all LED's. The circuit board 2 thus configured is inserted into a reflector 4, or the reflector 4 is drawn over the LED chips 1.

A light disk 5 is placed on the reflector 4. This light disk 5 first serves to protect the configuration, and second, the luminophore 6 is mixed into this light disk. The blue light (or the ultra-violet emission) that passes through the light disk 5 is proportionally converted upon passage through the luminophore 6 into a second spectral region, so that the overall impression of white light is created. Losses through waveguiding effects, which may occur in parallel plates are reduced by the opaque, scattering characteristics of the disk. Further, the reflector 4 ensures that only pre-directed light strikes the light disk 5 so that total reflection effects may be reduced in advance.

Figure 8:
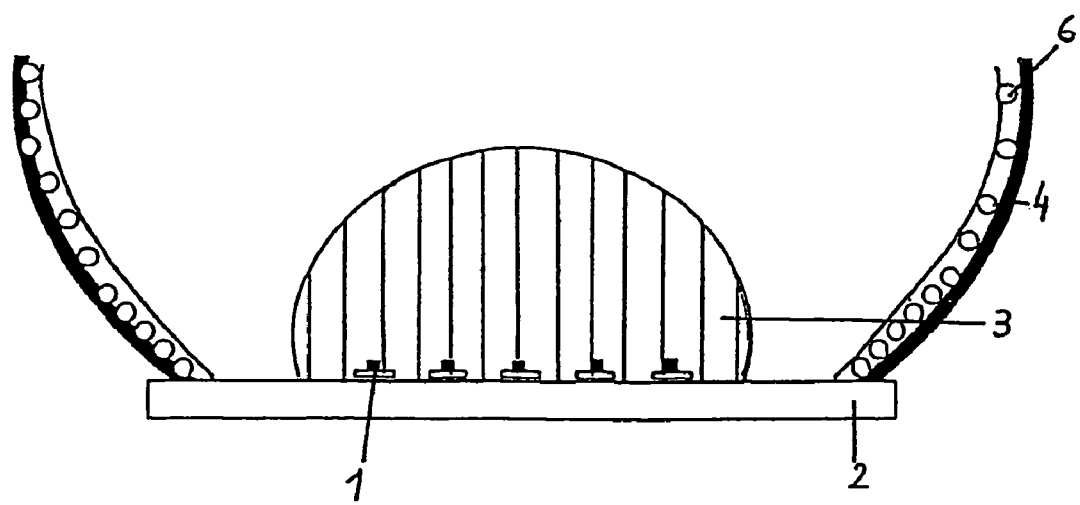
Figure 9:
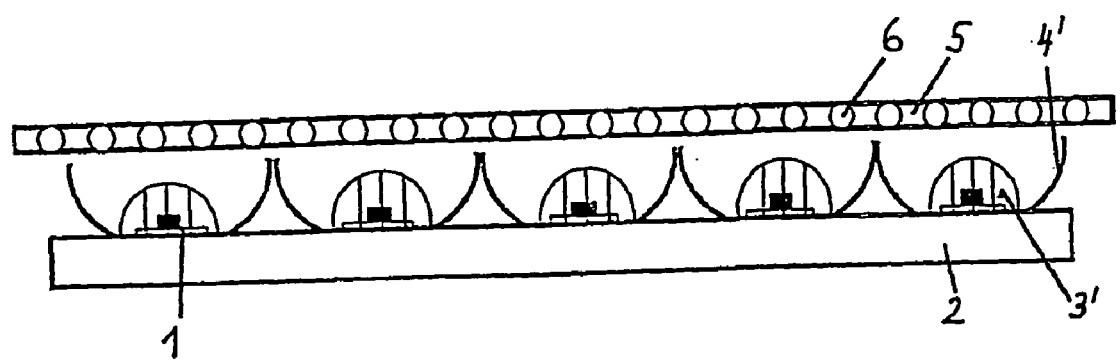
Figure 10:
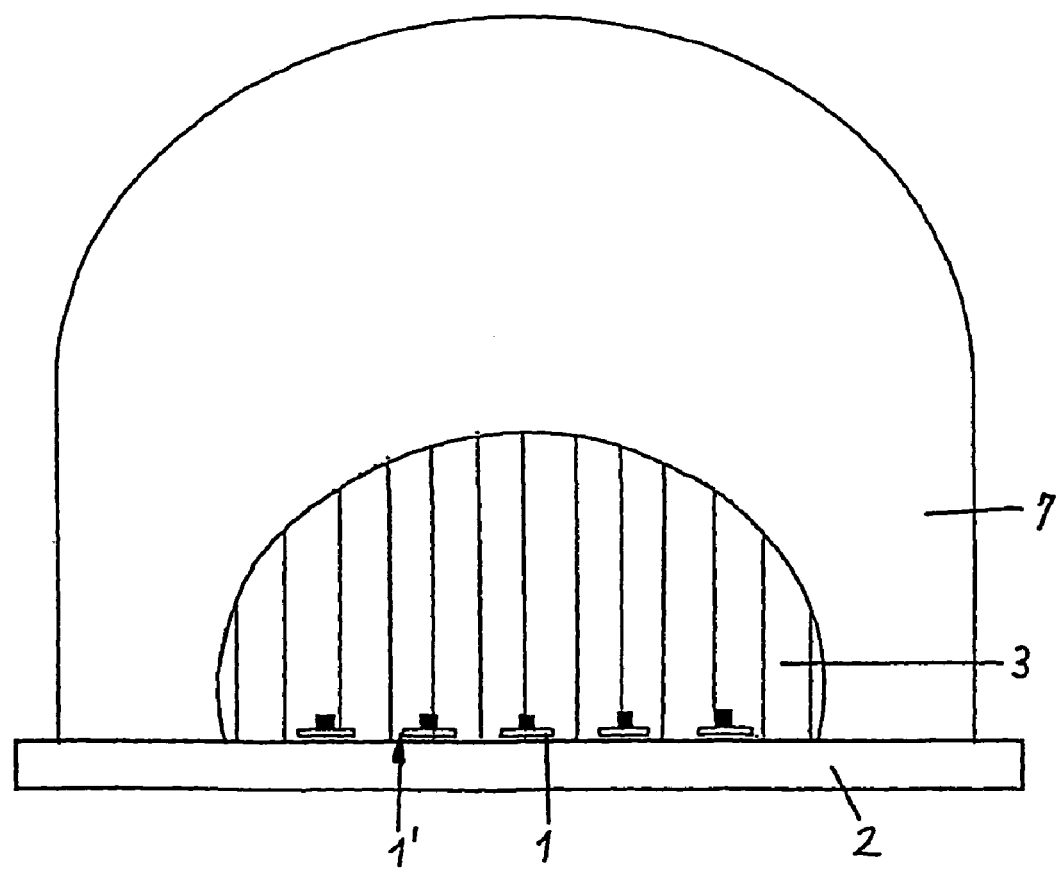

It is also possible to mount the luminophore 6 onto the reflector 4, as shown in FIG. 8. No light disk is required in this case.

Alternatively, a reflector 4' may be placed over each LED chip (see FIG. 9), and the reflector may be poured out in a domed shape (encapsulation medium 31) and a light disk 5 may be positioned above each reflector 3' Or above the entire assembly.

It is useful in the manufacture of illumination sources to use LED arrays instead of individual LED's. In a preferred version of the invention, color conversion is performed as follows on an LED array 1' (see FIG. 10), in which the LED chips 1 area assembled directly on the circuit board 2:

A LED array 1' (see FIG. 10) is attached to a transparent polymer lens 7 consisting of a different material (e.g., PMMA) by means of a casting compound 3 (e.g., epoxy resin). The material of the polymer lens 7 and of the casting compound 3 are so selected that they possess refractive indices that are as close to each other as possible, or phase-adapted. The casting compound 3 is located in a maximally hemispherical- or ellipsoid-shaped hollowing of the polymer lens 7. The shape of the hollowing is significant in that the color conversion material is dispersed in the casting compound 3, and it may thus be ensured by its shape that angle-independent emission colors are created. Alternatively, the array may first be cast with a transparent casting compound and subsequently be attached to the polymer lens by means of the casting compound containing the color conversion material.

In order to produce white LED's with particularly good color reproduction n which at least two different luminophores are used, it is useful not to disperse the two together in a matrix, but rather to disperse and mount them separately. This particularly applies to combinations in which the final light color is created by means of a multi-step color-conversion process. That means that the emission color with the longest wavelength is generated in an emission process that progresses as follows: absorption of LED emission by the first luminophore; emission from the first luminophore; absorption of the emission from the first luminophore by the second luminophore; and emission from the second luminophore. It is particularly preferred for such a process to arrange the individual materials in order in the direction the light is spreading, since the concentration of the materials may be reduced in comparison to a combined dispersion of the individual materials.

This invention is not limited to the described embodiments. The luminophores may also be included in the polymer lens (or in another optical element). It is also possible to position the luminophore directly above the LED dice or on the surface of the transparent casting compound, The luminophore may also be mounted in a matrix together with scattering particles. This prevents fading within the matrix and ensures uniform light emission.

The invention claimed is:

1. A light source to create white light, comprising:
an LED that emits emission in the range between near-ultraviolet and blue; and
a luminophore that absorbs a portion of the near-ultraviolet to blue emission and emits an emission in another spectral region,
wherein the luminophore comprises an alkaline-earth ortho-silicate activated with bivalent Europium, and a red-emitting luminophore.

2. The light source according to claim 1, wherein:
the LED emits emission in the range between 370 and 390 nm.

3. The light source according to claim 2, wherein:
the luminophore further comprises a blue-emitting luminophore.

4. The light source according to claim 1, wherein:
the red-emitting luminophore is selected from $Y(V,P,Si)_4$:Eu,Bi, $Y_2O_2S$:Eu,Bi, and alkaline-earth Magnesium di-silicates activated with Europium or Manganese.

5. The light source according to claim 3, wherein:
the blue-emitting luminophore comprises alkaline-earth aluminates activated with Europium and Manganese.

6. The light source according to claim 1, wherein:
the alkaline-earth ortho-silicate activated with bivalent Europium is of the following composition:

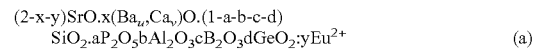

$$(2-x-y)SrO.x(Ba_u,Ca_v)O.(1-a-b-c-d)$$
$$SiO_2.aP_2O_5bAl_2O_3cB_2O_3dGeO_2:yEu^{2+} \quad (a)$$

where $0 \leq x < 1.6, 0.005 < y < 0.5, x+y < 1.6,$ $0 \leq a,b,c,d < 0.5,$ and $u+v=1$, or

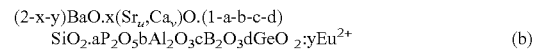

$$(2-x-y)BaO.x(Sr_u,Ca_v)O.(1-a-b-c-d)$$
$$SiO_2.aP_2O_5bAl_2O_3cB_2O_3dGeO_2:yEu^{2+} \quad (b)$$

where $0.01 \leq x < 1.6,\ 0.005 < y < 0.5,$ $0 \leq a,b,c,d < 0.5,\ u+v=1,$ and $x \cdot u \leq 0.4.$ 7. The light source according to claim 6, wherein:
at least one of the values a,b,c, and d are greater than 0.01.

8. The light source according to claim 6, wherein:
a portion of the Silicon in the luminophore is replaced with Gallium.

9. The light source according to claim 1, wherein:
the luminophore comprises a scattering particle.

* * * * *